US012598557B2

(12) United States Patent
Sheppard

(10) Patent No.: US 12,598,557 B2
(45) Date of Patent: Apr. 7, 2026

(54) SYSTEMS AND METHODS FOR ANTENNA POWER ATTENUATION

(71) Applicant: Verizon Patent and Licensing Inc., Basking Ridge, NJ (US)

(72) Inventor: Christopher J Sheppard, Carrollton, TX (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 381 days.

(21) Appl. No.: 18/123,295

(22) Filed: Mar. 19, 2023

(65) Prior Publication Data

US 2024/0314706 A1 Sep. 19, 2024

(51) Int. Cl.
| | |
|---|---|
| *H04W 52/28* | (2009.01) |
| *G01R 29/08* | (2006.01) |
| *G06V 20/40* | (2022.01) |
| *G06V 20/52* | (2022.01) |
| *G06V 40/10* | (2022.01) |
| *H04W 52/30* | (2009.01) |

(52) U.S. Cl.
CPC ...... *H04W 52/285* (2013.01); *G01R 29/0814* (2013.01); *G06V 20/41* (2022.01); *G06V 20/52* (2022.01); *G06V 40/10* (2022.01); *H04W 52/30* (2013.01)

(58) Field of Classification Search
CPC .... H04W 52/285; H04W 52/30; G06V 20/52; G06V 40/10; G06V 20/41; G01R 29/0814
See application file for complete search history.

(56) References Cited

U.S. PATENT DOCUMENTS

| | | | |
|---|---|---|---|
| 9,338,679 B1 | 5/2016 | Sheppard | |
| 2020/0106468 A1* | 4/2020 | Sahoo | ............... H01Q 1/245 |

OTHER PUBLICATIONS

Cleveland, R., Sylvar, D., Ulcek, J. (1997). Evaluation Compliance with FCC Guidelines for Human Exposure to Radiofrequency Electromagnetic Fields (97-01 ed.). Federal Communications Commission, 65 pages.

Cleveland, R., Ulcek, J.: "Questions and Answers about Biological Effects and Potential Hazards of Radiofrequency Electromagnetic Fields" (4th ed.). Federal Communications Commission, Aug. 1999, OET Bulletin 5, 4th Edition, 14 pages.

Hammoudeh, M. A. A., Alsaykhan, M., Alsalameh, R., & Althwaibi, N. (2022). Computer Vision: A Review of Detecting Objects in Videos—Challenges and Techniques. International Journal of Online & Biomedical Engineering, 18(1), 15-27. https://doi.org/10.3991/ijoe.v18i01.27577; retrieved on Dec. 8, 2022, 13 pages.

(Continued)

*Primary Examiner* — Curtis B Odom

(57) ABSTRACT

One or more computing devices, systems, and/or methods for determining radio frequency (RF) emission metrics associated with an antenna system and/or controlling a transmitter power of the antenna system based upon the determined RF metrics. In an example, a video stream is received from a camera associated with an antenna system. An object is detected in a video frame of the video stream. A separation distance between the object and a location associated with the antenna system is determined. A transmitter power of the antenna system is controlled and/or an alert is transmitted based upon the separation distance.

20 Claims, 8 Drawing Sheets

(56) References Cited

OTHER PUBLICATIONS

Hollows, G., James, N. (2022). Understanding Focal Length and Field of View. https://www.edmundoptics.com/knowledge-center/application-notes/imaging/understanding-focal-length-and-field-of-view/ 3 pages, Retrieved on Dec. 8, 2022.

Knipe, A. (2020). Distance Calculation using Triangle Similarity: How to Find the Distance Between an Object and Your Robot. https://www.chiefdelphi.com/t/distance-calculation-using-triangle-similarity-how-to-find-the-distance-between-an-object-and-your-robot/372264 3 pages, Retrieved on Dec. 8, 2022.

OpenCV-Python Tutorials: "Changing Colorspaces." (2016). Retrieved from https://opencv24-python-tutorials.readthedocs.io/en/latest/py_tutorials/py_imgproc/py_colorspaces/py_colorspaces.html, 3 pages, Retrieved on Dec. 8, 2022.

Paljanos, A, & Munteanu, C.: "An Overview of Standards and Regulation Concerning Exposure to Radiofrequency Fields", Scientific Bulletin, 20(1), pp. 145-150, 6 pages, Retrieved on Dec. 8, 2022.

Rosebrock, Adrian: "Measuring Distance Between Objects in an Image with OpenCV", https://pyimagesearch.com/2016/04/04/measuring-distance-between-objects-in-an-image-with-opencv/; Apr. 4, 2016, 56 pages, Retrieved on Dec. 8, 2022.

TensorFlow2: Object Detection API tutorial. (2020), retrieved from https://tensorflow-object-detection-api-tutorial.readthedocs.io/en/latest/?badge=latest—3 pages, Retrieved on Dec. 8, 2022.

Turban, E & Watkins, P.R.: "Integrating Expert Systems and Decision Support Systems", MIS Quarterly/Jun. 1986, pp. 121-136 (16 pages).

Zhang, S.: "Detecting People in Real-time Using Deep Learning.", https://medium.com/@schuman.zhang/detecting-people-in-real-time-using-deep-learning-84859c9682d2, (Jul. 10, 2018), 7 pages, Retrieved Dec. 8, 2022.

* cited by examiner

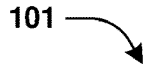
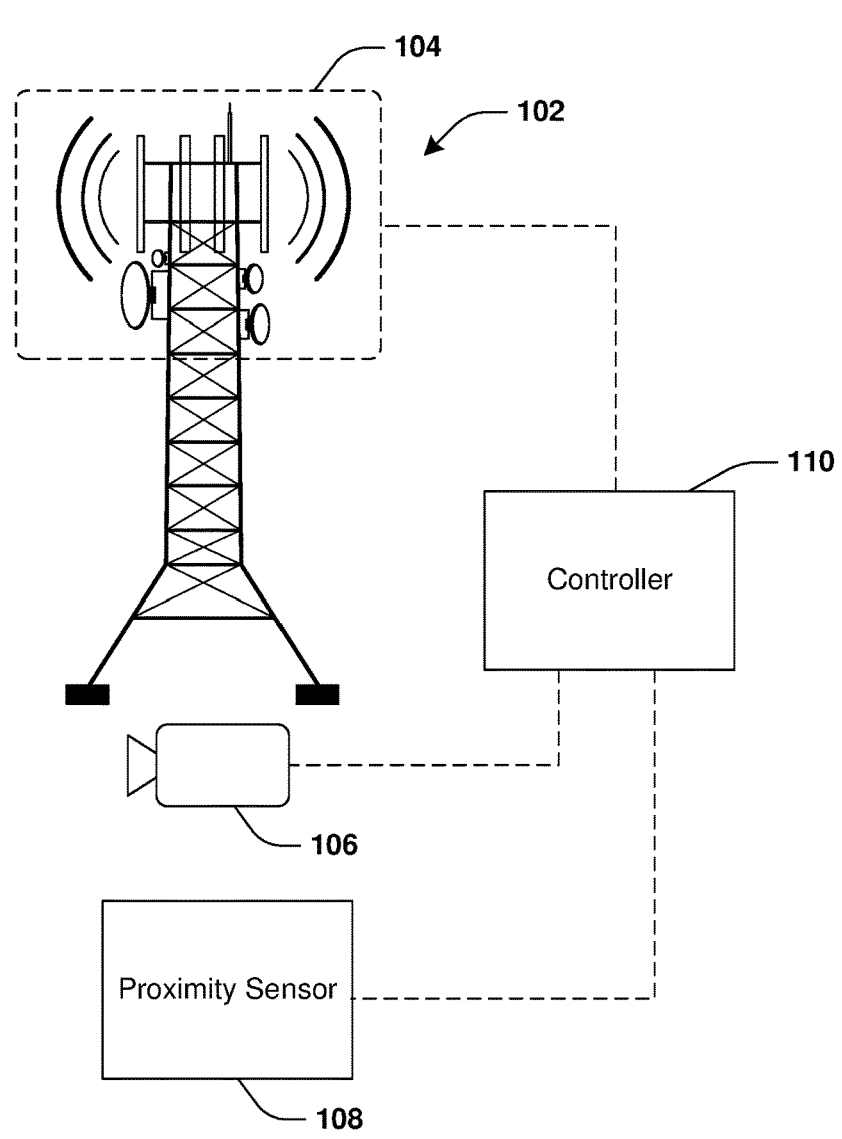
FIG. 1

RECEIVE VIDEO STREAM FROM CAMERA — 202

DETECT OBECT IN VIDEO FRAME OF VIDEO STREAM — 204

DETERMINE SEPARATION DISTANCE BETWEEN OBECT AND LOCATION ASSOCIATED WITH ANTENNA SYSTEM — 206

DETERMINE MEASURE OF RF EMISSIONS ASSOCIATED WITH OBECT — 208

COMPARE MEASURE OF RF EMISSIONS WITH THRESHOLD MEASURE OF RF EMISSIONS — 210

IN RESPONSE TO DETERMINATION THAT MEASURE OF RF EMISSIONS MEETS THRESHOLD MEASURE OF RF EMISSIONS, PERFORM ONE OR MORE CORRECTIVE ACTIONS — 212

Person: 72%

SYSTEMS AND METHODS FOR ANTENNA POWER ATTENUATION

BACKGROUND

An antenna system may be used to transmit wireless signals to one or more devices within range. For example, the wireless signals may be transmitted to provide network coverage to the devices. However, persons close to the antenna system may be exposed to radio frequency (RF) emissions emitted by the antenna system.

BRIEF DESCRIPTION OF THE DRAWINGS

While the techniques presented herein may be embodied in alternative forms, the particular embodiments illustrated in the drawings are only a few examples that are supplemental of the description provided herein. These embodiments are not to be interpreted in a limiting manner, such as limiting the claims appended hereto.

FIG. 1 is a diagram illustrating an example system for determining radio frequency (RF) emission metrics associated with an antenna system and/or controlling a transmitter power of the antenna system based upon the determined RF metrics according to some embodiments.

FIG. 2 is a flow chart illustrating an example method for determining RF emission metrics associated with an antenna system and/or controlling a transmitter power of the antenna system based upon the determined RF metrics in accordance with an embodiment.

DETAILED DESCRIPTION OF EXAMPLE EMBODIMENTS

Figure 3A:
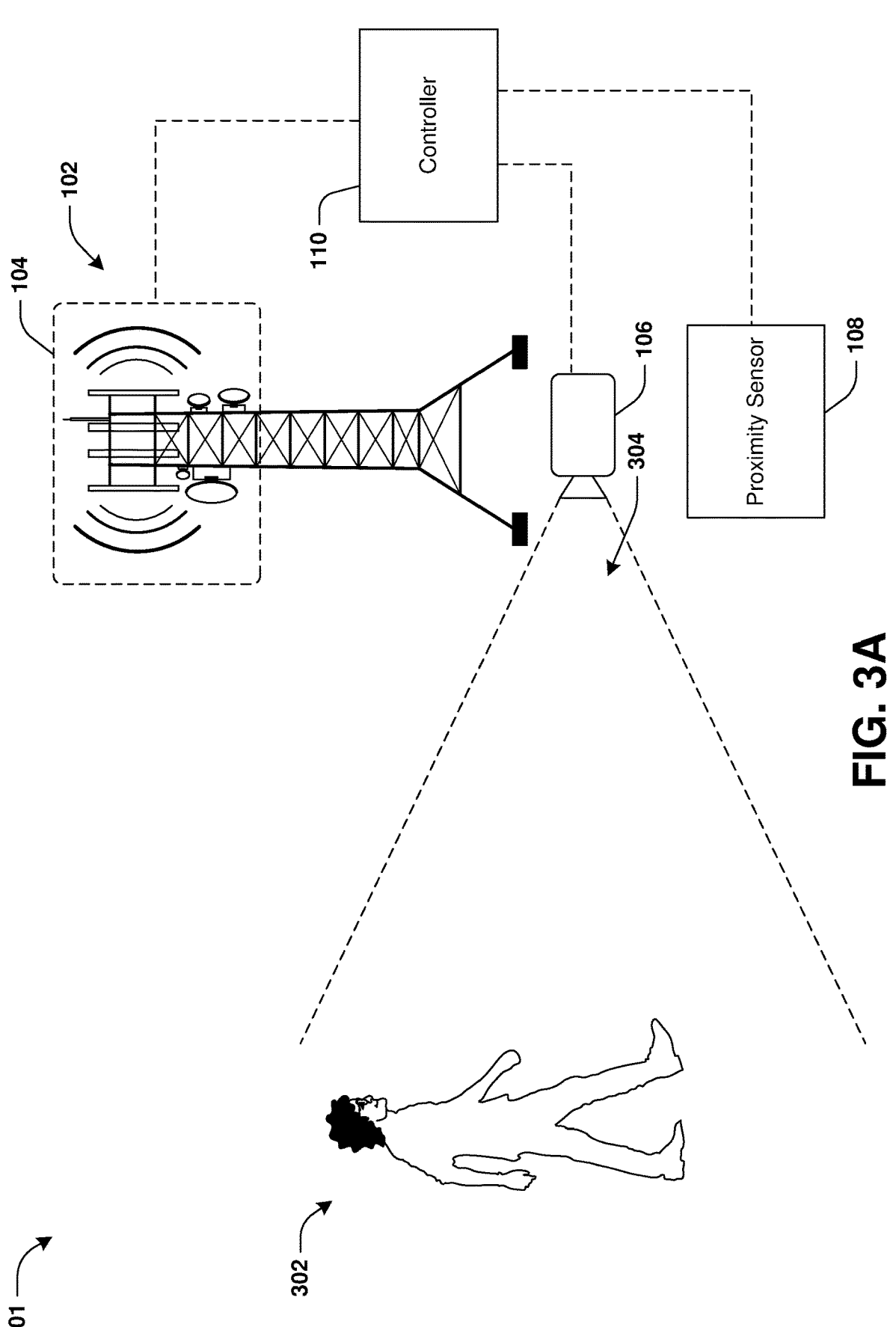
FIG. 3A is a diagram illustrating an example system for determining RF emission metrics associated with an antenna system and/or controlling a transmitter power of the antenna system based upon the determined RF metrics, where a person enters a field of view of a camera according to some embodiments.

Subject matter will now be described more fully hereinafter with reference to the accompanying drawings, which form a part hereof, and which show, by way of illustration, specific example embodiments. This description is not intended as an extensive or detailed discussion of known concepts. Details that are well known may have been omitted, or may be handled in summary fashion.

The following subject matter may be embodied in a variety of different forms, such as methods, devices, components, and/or systems. Accordingly, this subject matter is not intended to be construed as limited to any example embodiments set forth herein. Rather, example embodiments are provided merely to be illustrative. Such embodiments may, for example, take the form of hardware, software, firmware or any combination thereof.

The following provides a discussion of some types of scenarios in which the disclosed subject matter may be utilized and/or implemented.

One or more systems and/or techniques for determining radio frequency (RF) emission metrics associated with an antenna system and/or controlling a transmitter power of the antenna system based upon the determined RF metrics are provided. Wireless communication networks may be required to comply with a wide array of regulations established by one or more regulatory agencies, such as the Federal Communications Commission (FCC), the Federal Aviation Administration (FAA), the Environmental Protection Agency (EPA), and/or one or more other regulatory agencies. The regulations include RF emission regulations that restrict the amount of RF emissions that a person can be exposed to from a transmitting antenna (e.g. a small cell antenna).

To comply with RF emission regulations and/or mitigate the potential for overexposure to RF emissions, some systems implement fixed (e.g., permanent) power reduction of a transmitting antenna. However, permanently reducing a transmitter power of a transmitting antenna may reduce a size of a coverage area associated with the transmitting antenna. Fixed power reductions of antennas (e.g., antennas in areas with intermittent human traffic) may result in gaps in network coverage between the antennas, which may require high-cost fill-in antennas to be constructed in the gaps. Alternatively and/or additionally, some systems rely upon construction of obstructions (e.g., barriers, traffic cones, etc.) and/or signage meant to keep persons out of a space associated with potential overexposure to RF emissions.

In accordance with some of the embodiments herein, a video stream received from a camera associated with an antenna system is monitored for detection of one or more objects, e.g. an animal, a person or the like. For example, a person may be detected in a video frame of the video stream, and a separation distance between the person and a location associated with the antenna system may be determined. The separation distance may be determined based upon the video stream, and/or may be determined using a proximity sensor. A transmitter power of the antenna system is controlled (e.g., dynamically attenuated) based upon the separation distance. For example, when the person moves towards the antenna system (and thus the separation distance decreases), the transmitter power of the antenna system may be reduced to prevent overexposure of the person to RF emissions. Alternatively and/or additionally, when the person moves away from the antenna system (and thus the separation distance increases), the transmitter power of the antenna system may be increased while keeping the transmitter power under a level that would result in overexposure of the person to RF emissions.

As compared to systems that rely upon fixed power reduction of antenna systems to comply with RF emission regulations, dynamically adjusting the transmitter power using the techniques provided herein may provide for improved network coverage of the antenna system and/or an increased network coverage size associated with the antenna system. For example, dynamically adjusting the transmitter power of the antenna system (rather than always using a fixed power reduction, for example) may optimize performance of the antenna system. Alternatively and/or additionally, the techniques disclosed herein may provide for reduced manual effort and/or costs as compared to some systems that may require at least one of (i) manually determining a fixed power reduction to apply to the antenna system, (ii) constructing new fill-in antenna systems to provide coverage to gaps that result from fixed power reductions of antenna systems, (iii) constructing obstructions and/or signage to keep persons from entering a space associated with potential overexposure to RF emissions, and/or (iv) performing periodic maintenance to maintain the obstructions and/or signage.

FIG. 1 illustrates an example of a system 101 for determining RF emission metrics associated with an antenna system and/or controlling a transmitter power of the antenna system based upon the determined RF metrics. In some examples, the system 101 comprises an antenna system 102, a controller 110, a camera 106 and/or a proximity sensor 108. The antenna system 102 may comprise at least one of a wireless communication site, an antenna branch, a transmission and/or reception point (TRP), a base station, a cell tower, a radio transmitter and/or transceiver (e.g., a radio station), etc. The antenna system 102 may comprise one or more antennas 104 used to transmit and/or receive RF signals (e.g., uplink signals and/or downlink signals) to and/or from one or more devices comprising at least one of a user equipment (UE) (e.g., at least one of a phone, a smartphone, a tablet, a laptop, a computer, a wearable device, a smart device, any other type of computing device, hardware, etc.), a second wireless communication site, a second antenna branch, a second TRP, a second base station, a second cell tower, a radio receiver and/or transceiver, etc. In an example, the antenna system 102 may provide network coverage to one or more UEs. For example, the one or more UEs may be provided with telecommunication services by the antenna system 102, such as at least one of cellular service (e.g., 5G service, 4G service and/or other type of cellular service), internet service (e.g., cellular internet service, satellite internet service, 5G internet service, and/or other type of internet service), messaging service, etc.

In some examples, the controller 110 is connected to the antenna system 102, the camera 106 and/or the proximity sensor 108. In some examples, the camera 106 and/or the proximity sensor 108 are located proximal the antenna system 102 and/or the one or more antennas 104. For example, the camera 106 and/or the proximity sensor 108 may be within a threshold distance (e.g., a distance of 10 feet) of the antenna system 102 and/or the one or more antennas 104. Alternatively and/or additionally, the camera 106 and/or the proximity sensor 108 may be attached to the antenna system 102 and/or the one or more antennas 104.

An embodiment of determining RF emission metrics associated with an antenna system and/or controlling a transmitter power of the antenna system based upon the determined RF metrics is illustrated by an exemplary method 200 of FIG. 2, and is further described in conjunction with the system 101 of FIG. 1 and a system 301 of FIGS. 3A-3E.

At 202 of FIG. 2, a video stream is received (by the controller 110, for example) from the camera 106. For example, the video stream may comprise a real-time video stream comprising a real time representation of a field of view 304 (shown with two dashed-lines in FIG. 3A) of the camera 106. In an example, the camera 106 may record (e.g., continuously record) the video stream and/or may feed (e.g., continuously feed) the video stream to the controller 110.

At 204 of FIG. 2, a first object may be detected (by the controller 110, for example) in a first video frame of the video stream. The controller 110 may detect the first object in the first video frame while monitoring for (e.g., continuously monitoring for) one or more types of objects (e.g., at least one of a person, an animal, a vehicle, etc.) in the video stream. For example, the controller 110 may monitor for the one or more types of objects in the video stream by performing image processing on received video frames of the video stream. The image processing may include (i) performing object detection on a received video frame of the video stream to detect one or more objects, and/or (ii) performing object classification to classify the one or more detected objects. The object detection and/or the object classification may be performed using one or more computer vision techniques.

Figure 3B:
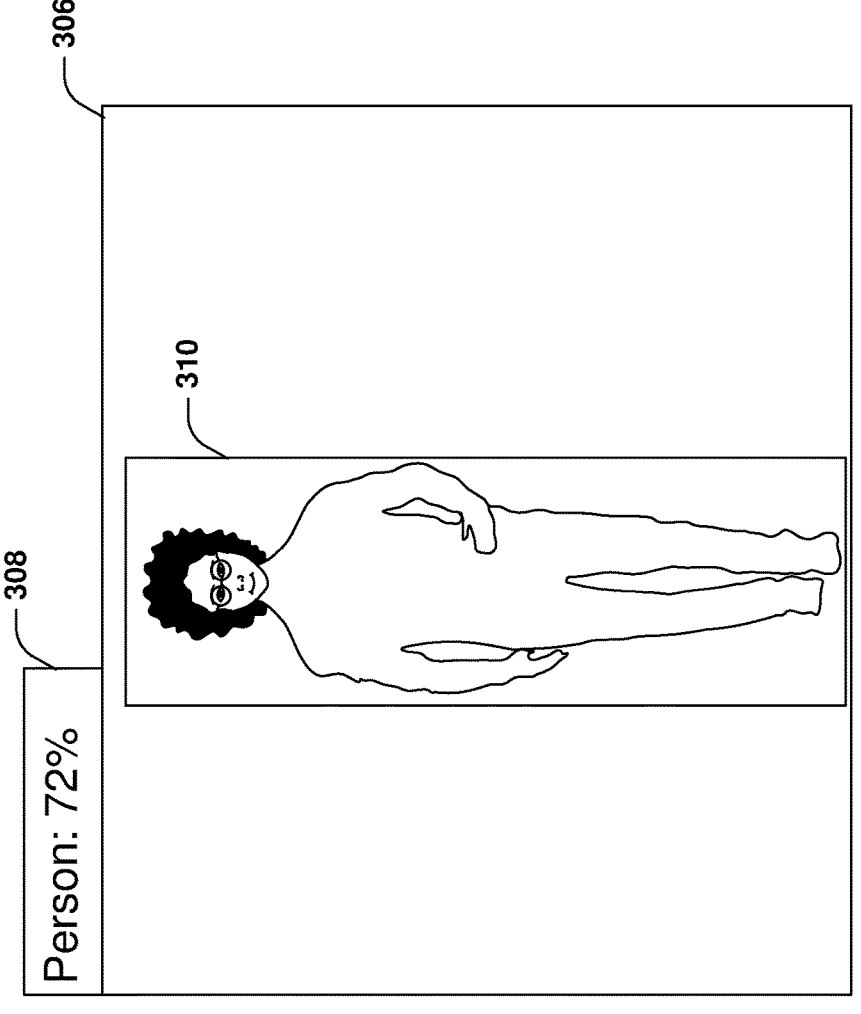
FIG. 3B is a diagram illustrating an example system for determining RF emission metrics associated with an antenna system and/or controlling a transmitter power of the antenna system based upon the determined RF metrics, where a person within a field of view of a camera is detected according to some embodiments.

FIGS. 3A-3B illustrates an example scenario in which the first object corresponds to a first person 302 detected using the video stream from the camera 106. Referring to FIG. 3A, the first person 302 may enter the field of view 304 of the camera 106, and thus, the video stream (sent to the controller 110, for example) may comprise a representation of the first person 302.

Referring to FIG. 3B, object detection (e.g., object segmentation) may be performed (by the controller 110, for example) on the first video frame (shown with reference number 306) to identify one or more objects in the first video frame 306. The one or more identified objects may comprise the first object (shown with reference number 310) corresponding to the first person 302. In some examples, the object detection may be performed using an object detection model (e.g., an Artificial Intelligence (AI) model used for object detection). In some examples, the object detection model comprises a first machine learning model. The object detection model may be used to perform object segmentation to identify a boundary of an object (e.g., each object in the first video frame 306), such as the first object 310. The boundary of the object may correspond to one or more boundaries of one or more regions and/or pixels, in the first video frame 306, that are occupied by the object.

Object classification may be performed (by the controller 110, for example) to determine a classification 308 of the first object 310. In some examples, the classification 308 may indicate that the first object 310 corresponds to a person classification and/or may indicate a confidence score (e.g., 72%) of the classification 308 (e.g., a confidence that the classification 308 is correct). The confidence score may be compared with a confidence score threshold (e.g., 50% or other value). In some examples, the classification 308 may be ignored and/or discarded (and/or the classification 308 may not be relied upon to make a determination that there is a person in the first video frame 306) in response to the confidence score not meeting (e.g., not exceeding) the confidence score threshold. Accordingly, the first person 302 may be detected based upon (i) the classification 308 indicating that the first object 310 corresponds to the person classification and/or (ii) the confidence score of the classification 308 meeting (e.g., exceeding) the confidence score threshold. In some examples, the classification 308 may be determined using an object classification model (e.g., an AI model used for object classification). In some examples, the object classification model comprises a second machine learning model.

In accordance with some embodiments, a machine learning model provided herein (e.g., at least one of the first machine learning model, the second machine learning model, etc.) may comprise at least one of a tree-based model, a machine learning model used to perform linear regression, a machine learning model used to perform logistic regression, a decision tree model, a support vector machine (SVM), a Bayesian network model, a k-Nearest Neighbors (kNN) model, a K-Means model, a random forest model, a machine learning model used to perform dimensional reduction, a machine learning model used to perform gradient boosting, a neural network model (e.g., a deep neural network model and/or a convolutional neural network model), etc. In some examples, the machine learning model (e.g., at least one of the first machine learning model, the second machine learning model, etc.) may be trained using one or more training datasets (e.g., video classification datasets and/or image classification datasets). The one or more training datasets may comprise one or more video and/or image classification datasets, one or more datasets of one or more computer vision libraries, and/or one or more other datasets (from one or more libraries for AI and/or machine learning, for example). In an example, the one or more training datasets may comprise one or more video and/or image classification datasets of one or more Tensor-Flow® libraries and/or one or more datasets of one or more OpenCV® computer vision libraries.

In some examples, the object detection (performed to detect the first object 310, for example) and/or the object classification (performed to determine the classification 308 of the first object 310, for example) may be determined using an inference engine (e.g., a TensorFlow® inference engine). In an example, the object detection may be performed using a TensorFlow® object detection model. In some examples, the object detection and/or the object classification may be performed using one or more other techniques known to those skilled in the art.

Figure 3C:
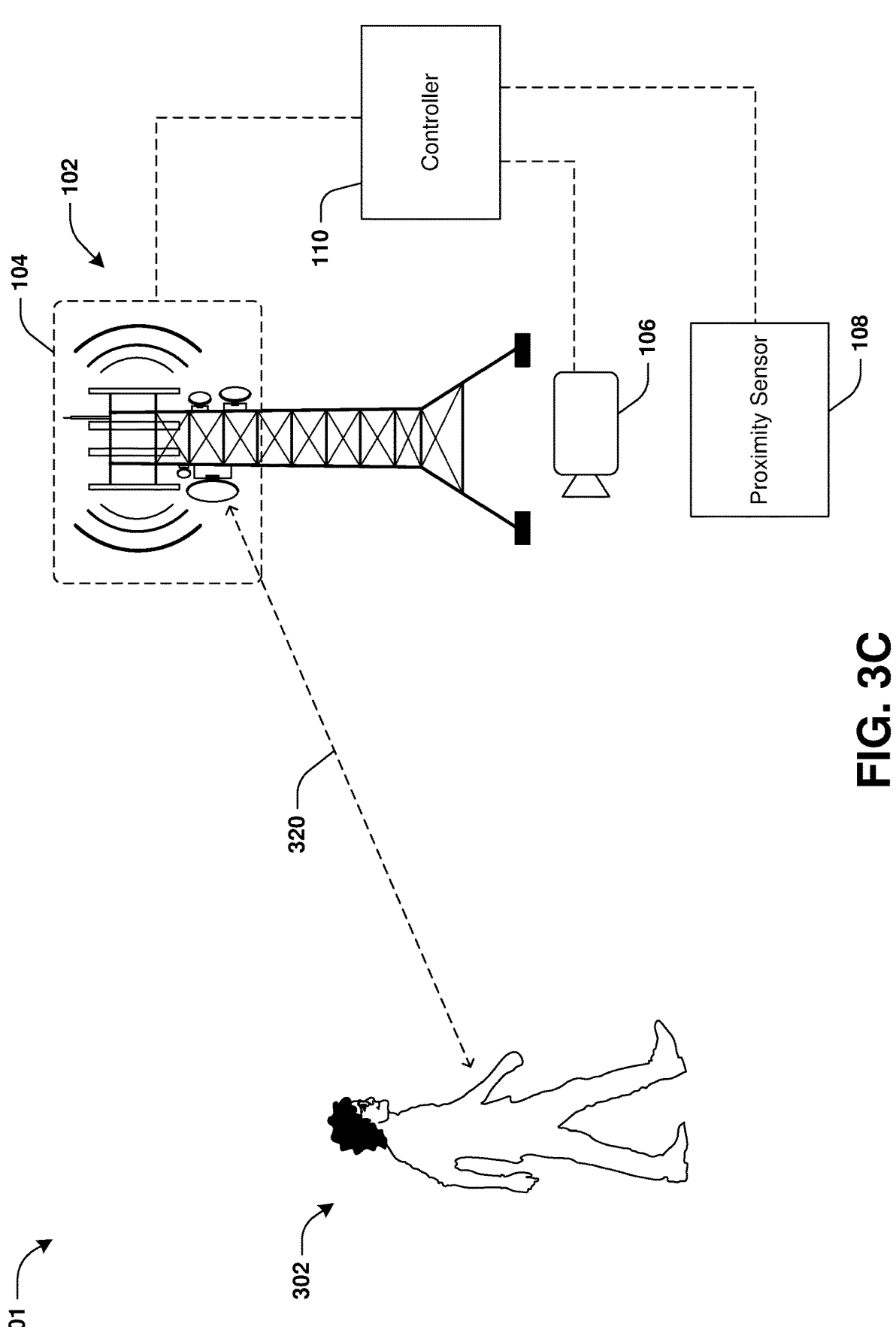
FIG. 3C is a diagram illustrating an example system for determining RF emission metrics associated with an antenna system and/or controlling a transmitter power of the antenna system based upon the determined RF metrics, where a separation distance associated with a person and an antenna system is determined according to some embodiments.

At 206 of FIG. 2, a separation distance between the first object 310 (e.g., the first person 302) and a first location associated with the antenna system 102 may be determined (by the controller 110, for example). The separation distance may be determined in response to detecting the first object 310 (e.g., the first person 302) in the first video frame 306 of the video stream. In some examples, the controller 110 may not determine an object separation distance between a non-human object detected in the video stream and the first location (e.g., the controller 110 may only determine separation distances between the first location and persons that are detected in the video stream). The first location may correspond to a location of the antenna system 102, a location of the one or more antennas 104, a location of the proximity sensor 108, a location of the camera 106, or other location. FIG. 3C illustrates an example of the separation distance (shown with reference number 320). In FIG. 3C, the first location corresponds to a location of an antenna of the one or more antennas 104 (e.g., the separation distance 320 corresponds to a distance between the first object 310 (e.g., the first person 302) and the location of the antenna of the one or more antennas 104). Other examples of the first location and/or the separation distance 320 are within the scope of the present disclosure.

In some examples, the separation distance 320 may be determined using the proximity sensor 108. For example, the proximity sensor 108 may emit a laser beam (towards the first object 310, for example), and/or may determine the separation distance 320 based upon a return signal received by the proximity sensor 108 (e.g., the return signal may comprise a reflection of the laser beam).

In some examples, the separation distance 320 may be determined based upon the first video frame 306 and/or one or more other video frames (of the video stream) in which the first object 310 is apparent and/or detected). In some examples, the first video frame 306 is analyzed to identify a boundary of the first object 310 (e.g., a boundary associated with the first person 302). In an example, the object detection model may be used to perform object segmentation to identify the boundary of the first object 310. The separation distance 320 may be determined based upon the boundary of the first object 310 and/or a focal length associated with the camera 106. In some examples, the focal length may be approximated (e.g., via dynamic approximation). In an example, the separation distance 320 may be determined based upon end-points of the boundary of the first object 310 and/or the focal length. For example, the separation distance 320 may be determined using (i) triangle similarities referencing the end-points of the boundary of the first object 310 and/or (ii) the focal length. The separation distance 320 may also be determined using one or more other known techniques.

At 208 of FIG. 2, a first measure of RF emissions associated with the first object 310 (e.g., the first person 302) may be determined (by the controller 110, for example). For example, the first measure of RF emissions may be determined (e.g., predicted) based upon the separation distance 320, a transmitter power of the antenna system 102 and/or one or more characteristics of the antenna system 102 (e.g., predefined characteristics of the antenna system 102). The transmitter power may correspond to an antenna transmitter power with which the one or more antennas 104 of the antenna system 102 perform signal transmissions. In some examples, the transmitter power may correspond to a maximum transmitter power of the antenna system 102. In some examples, the antenna system 102 performs signal transmission based upon the maximum transmitter power. For example, the antenna system 102 modulates a power with which the signal transmission is performed according to the maximum transmitter power (such that the power of the signal transmission does not exceed the maximum transmitter power, for example).

In some examples, the first measure of RF emissions corresponds to a measure of RF emissions, emitted by the antenna system 102, to which the first object 310 (e.g., the first person 302) is exposed. In some examples, the first measure of RF emissions is a function of the transmitter power of the antenna system 102, where an increase of the transmitter power is associated with an increase of the first measure of RF emissions. For example, the antenna system 102 performing signal transmissions with increased power may result in a higher amount of RF emissions from the antenna system 102 reaching the first object 310 (e.g., the first person 302). In some examples, the first measure of RF emissions is a function of the separation distance 320, where a decrease of the separation distance 320 is associated with an increase of the first measure of RF emissions. For example, the first object 310 (e.g., the first person 302) moving closer to the antenna system 102 may result in the first object 310 being exposed to a higher amount of RF emissions from the antenna system 102.

In some examples, the first measure of RF emissions may be determined based upon an electromagnetic field region of the first object 310 (e.g., the first person 302) relative to the antenna system 102 and/or the one or more antennas 104. In an example, the electromagnetic field region may be determined to be a near field region of the antenna system 102 or a far field region of the antenna system 102. RF emissions in the near field region behave differently than RF emissions in the far field region. Based upon a determination that the electromagnetic field region is the near field region of the antenna system 102, one or more first operations (e.g., near field calculations) may be performed (using the separation distance 320, the transmitter power and/or the one or more characteristics of the antenna system 102, for example) to determine the first measure of RF emissions. Alternatively and/or additionally, based upon a determination that the electromagnetic field region is the far field region of the antenna system 102, one or more second operations (e.g., far field calculations) may be performed (using the separation distance 320, the transmitter power and/or the one or more characteristics of the antenna system 102, for example) to determine the first measure of RF emissions. The one or more first operations (e.g., the near field calculations, which may be performed using a cylindrical model) may be different than the one or more second operations (e.g., the far field calculations) to reflect the difference in behavior of RF emissions in the near field region versus the far field region. In some examples, the electromagnetic field region may be determined using a forward-chaining inference engine (e.g., the forward-chaining inference engine may be used to determine whether the first object 310 is in the near field region of the antenna system 102 or the far field region of the antenna system 102).

In an example, the forward-chaining inference engine may determine the electromagnetic field region based upon pre-defined information associated with the antenna system 102 and/or a transmit frequency (associated with transmissions by the antenna system 102). If a detected object (e.g., at least one of a person, an animal, a vehicle, etc.) is located within a threshold distance (e.g., a calculated threshold distance) to the extent of the near field region (as defined by one or more regulatory agencies, for example), then the detected object is determined to be within the near field region and/or the one or more first operations (e.g., the near field calculations) may be performed to determine a measure of RF emissions associated with the detected object. If a detected object is located beyond a threshold distance (e.g., a calculated threshold distance) to the beginning of the far field region (as defined by one or more regulatory agencies, for example), then the detected object is determined to be within the far field region and/or the one or more second operations (e.g., the far field calculations) may be performed to determine a measure of RF emissions associated with the detected object. If a detected object is located beyond the extent of the near field region and within a threshold distance (e.g., a calculated threshold distance) to the beginning of the far field region (as defined by one or more regulatory agencies, for example), then the forward-chaining inference engine may (i) perform the one or more first operations (e.g., the near field calculations) to determine a near field measure of RF emissions associated with the detected object, (ii) perform the one or more second operations (e.g., the far field calculations) to determine a far field measure of RF emissions associated with the detected object, and (iii) compare the near field measure of RF emissions with the far field measure of RF emissions to select a measure of RF emissions (e.g., a least conservative measure of RF emissions). In an example, the smaller of, or the larger of, the near field measure of RF emissions and the far field measure of RF emissions is determined to be the measure of RF emissions associated with the detected object.

In some examples, the first measure of RF emissions may be determined based upon one or more transmitter power-to-separation distance relationships defined by one or more regulatory agencies, such as the FCC, the FAA, the EPA, and/or one or more other regulatory agencies. For example, the first measure of RF emissions may be determined using one or more relationships (e.g., equations) defined in R. Cleveland et al. Evaluation Compliance with FCC Guidelines for Human Exposure to Radiofrequency Electromagnetic Fields. Federal Communications Commission, Edition 97-01, 1997, which is incorporated by reference herein in its entirety.

At 210 of FIG. 2, the first measure of RF emissions may be compared (by the controller 110, for example) with a threshold measure of RF emissions. In some examples, the threshold measure of RF emissions may correspond to a measure of RF emissions that is deemed potentially unsafe for an object (e.g., at least one of a person, an animal, a vehicle, etc.) to be exposed to. The threshold measure of RF emissions may correspond to a regulatory limit (e.g., a predefined limit), such as a Maximum Permissible Exposure (MPE) limit for RF emissions (provided by the FCC or other regulatory agency, for example). Alternatively and/or additionally, the threshold measure of RF emissions may be set to a value lower than the MPE limit (according to a network provider and/or operator of the antenna system 102, for example). In an example, the threshold measure of RF emissions may be equal to a product of 0.95 and the MPE limit.

In some examples, the threshold measure of RF emissions may be determined based upon a status of the first object 310. In an example, the status of the first object 310 may correspond to a status of the first person 302. The status may be determined to be a first status (e.g., public status) or a second status (e.g., occupational status). RF emission regulations may be different for persons determined to have the first status (e.g., public status) than persons determined to have the second status (e.g., occupational status). For example, a first MPE limit for RF emissions for persons having the first status (e.g., public status) may be different than (e.g., lower than) a second MPE limit for RF emissions for persons having the second status (e.g., occupational status). For example, a person having the first status (e.g., public status) may correspond to a member of the public, and/or a person that may not have safety training or personal protective equipment (PPE) to mitigate negative impacts of RF emissions. A person having the second status (e.g., occupational status) may correspond to a person that has an occupation associated with RF emissions (e.g., an occupation in the telecommunications industry), and/or a person that has safety training and/or is equipped with PPE to mitigate negative impacts of RF emissions.

In some examples, the threshold measure of RF emissions may be determined based upon the status. For example, the threshold measure of RF emissions may be set to a first value based upon a determination that the status of the first person 302 is the first status (e.g., public status). Alternatively and/or additionally, the threshold measure of RF emissions may be set to a second value based upon a determination that the status of the first person 302 is the second status (e.g., occupational status). The first value associated with the first status (e.g., public status) may be lower than the second value associated with the second status (e.g., occupational status). In some examples, the first value may correspond to the first MPE limit for RF emissions. Alternatively and/or additionally, the first value may be lower than the first MPE limit for RF emissions (e.g., the first value may be equal to a product of 0.95 and the first MPE limit for RF emissions). In some examples, the second value may correspond to the second MPE limit for RF emissions. Alternatively and/or additionally, the second value may be lower than the second MPE limit for RF emissions (e.g., the second value may be equal to a product of 0.95 and the second MPE limit for RF emissions).

In some examples, the status (e.g., public or occupational) associated with the first person 302 may be determined using one or more facial recognition techniques. For example, one or more facial features of the first person 302 may be determined based upon the first video frame 306 and/or one or more other video frames (of the video stream) in which the first person 302 is apparent and/or detected. The one or more facial features may be compared with facial profiles in an occupational database to determine whether the first person 302 matches a facial profile in the occupational database. The status may be determined to be the first status (e.g., public status) based upon a determination that there is no match between the first person 302 and facial profiles in the occupational database. Alternatively and/or additionally, the status may be determined to be the second status (e.g., occupational status) based upon a determination that the first person 302 matches a facial profile in the occupational database.

In some examples, the status (e.g., public or occupational) associated with the first person 302 may be determined using one or more image recognition techniques. For example, one or more features (e.g., non-facial features, such as features indicative of clothing, equipment, a uniform, a badge, a logo, etc.) of the first person 302 may be determined based upon the first video frame 306 and/or one or more other video frames (of the video stream) in which the first person 302 is apparent and/or detected. The one or more features may be compared with profiles (e.g., non-facial profiles) in the occupational database to determine whether the first person 302 matches a profile in the occupational database (e.g., based upon whether the first person 302 is wearing a uniform and/or a badge associated with the second status and/or is interacting with equipment associated with the second status). The status may be determined to be the first status (e.g., public status) based upon a determination that there is no match between the first person 302 and profiles in the occupational database. Alternatively and/or additionally, the status may be determined to be the second status (e.g., occupational status) based upon a determination that the first person 302 matches a profile in the occupational database.

Alternatively and/or additionally, the status (e.g., public or occupational) associated with the first person 302 may be determined based upon a set of locations of persons (e.g., maintenance workers, technicians, etc.) having the second status (e.g., occupational status). In some examples, the set of locations may be tracked using client devices (e.g., the persons' phones). For example, an application (e.g., a maintenance application) may be installed on the client devices, and may send location data (to the controller 110, for example) to allow the set of locations to be determined and/or tracked. In some examples, a location tracking feature of the application may be activated when the persons are on-duty, and the location data may be sent (e.g., periodically sent) when the location tracking feature is activated. In some examples, a location of the first person 302 may be compared with the set of locations to determine whether the first person 302 is one of the persons having the second status. In some examples, the status may be determined to be the first status (e.g., public status) based upon a determination that the location of the first person 302 does not match (e.g., is not within a threshold distance of) a location (e.g., any location) of the set of locations. In some examples, the status may be determined to be the second status (e.g., occupational status) based upon a determination that the location of the first person 302 matches (e.g., is within a threshold distance of) a location of the set of locations (which may indicate that the first person 302 is one of the persons having the second status, for example).

In an example, if a second person (detected via the video stream, for example) is determined to have a status that is different than the status of the first person 302, a second measure of RF emissions associated with the second person may be compared with a different threshold measure of RF emissions (that has a value different than the threshold measure of RF emissions with which the first measure of RF emissions is compared) since the status of the second person is different than the status of the first person 302.

Figure 3D:
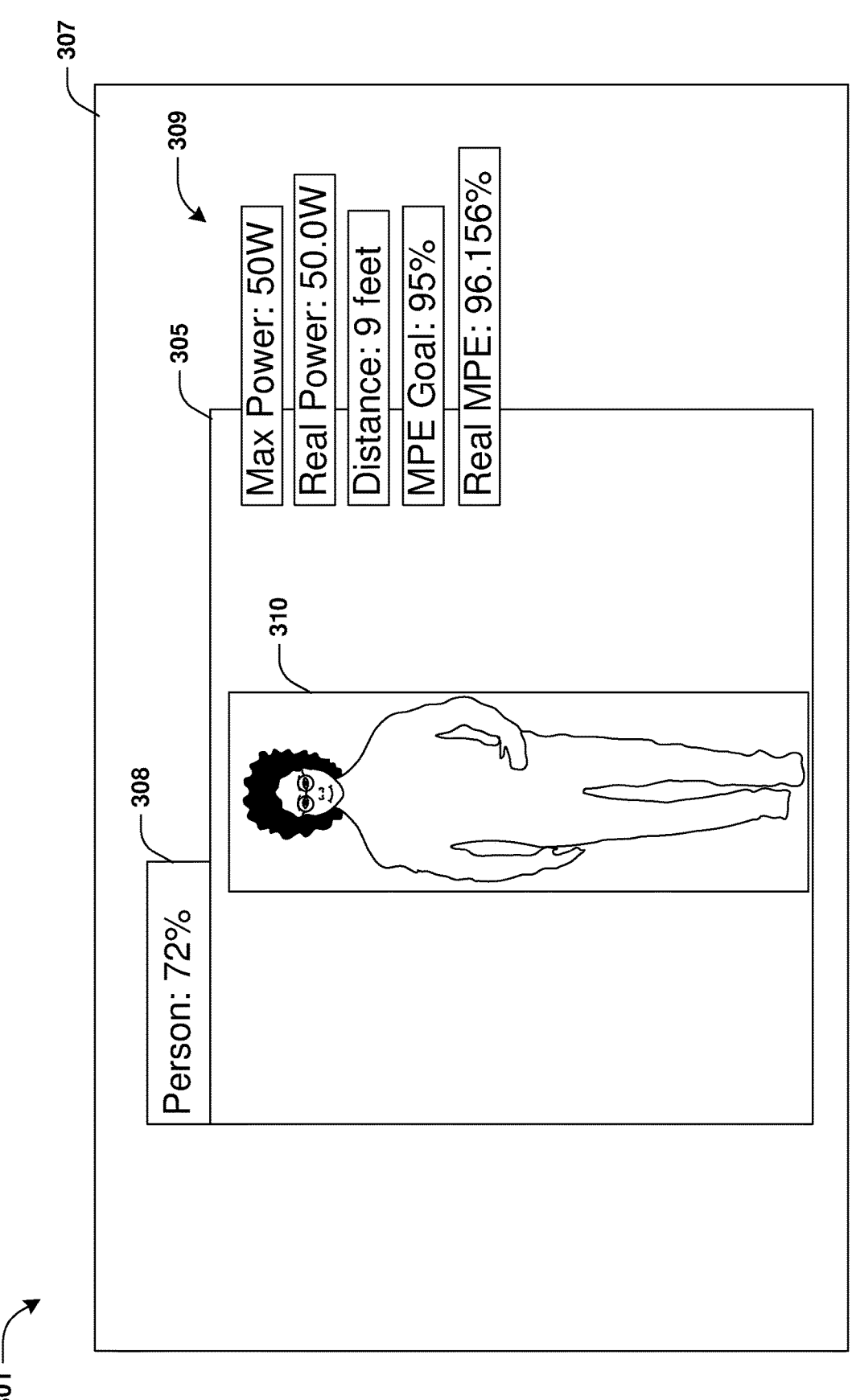
FIG. 3D is a diagram illustrating an example system for determining RF emission metrics associated with an antenna system and/or controlling a transmitter power of the antenna system based upon the determined RF metrics, where an interface displays a representation of a detected person is determined according to some embodiments.

FIG. 3D illustrates a representation 305 of the video stream being displayed via an interface 307 on a display of a client device, according to some embodiments. In an example, the client device may be associated with (e.g., accessed by) an antenna management agent tasked with managing one or more antenna systems (e.g., the antenna system 102 and/or one or more other antenna systems). The antenna management agent may use the interface 307 to determine whether any person (e.g., at least one of a member of the public, maintenance personnel, etc.) is detected near the antenna system 102 and/or view parameters and/or measurements associated with the person and/or the antenna system 102. In some examples, the interface 307 may comprise an indication of the first object 310, an indication of the classification 308 of the first object 310, and/or one or more indications 309 of one or more parameters and/or measurements associated with the first object 310 (e.g., the first person 302) and/or the antenna system 102. In an example, the one or more indications 309 may comprise (i) an indication of a maximum power parameter (e.g., 50 watts) associated with the antenna system 102, (ii) an indication of a real power parameter (e.g., 50 watts) associated with the antenna system 102, (iii) an indication of the separation distance 320 (e.g., nine feet), (iv) an indication of an MPE goal (e.g., 95%) and/or (v) an indication of a real MPE (e.g., 96.156%). In some examples, the maximum power parameter and/or the real power parameter may correspond to the transmitter power of the antenna system 102. In some examples, the MPE goal may correspond to a relationship between the threshold measure of RF emissions and the MPE limit for RF emissions. In an example, the MPE goal being set to 95% may indicate that the threshold measure of RF emissions is equal to a product of 0.95 and the MPE limit for RF emissions. In some examples, the real MPE may correspond to a relationship between the first measure of RF emissions and the MPE limit for RF emissions. In an example, the real MPE being set to 96.156% may indicate that the first measure of RF emissions is equal to a product of 0.96156 and the MPE limit for RF emissions. In some examples, the one or more indications 309 may be updated (in real time, for example). In some examples, the one or more indications 309 may comprise merely measurements such as separation distances related to one or more objects that are classified as persons (and may not comprise measurements such as separation distances related to non-human objects).

Figure 3E:
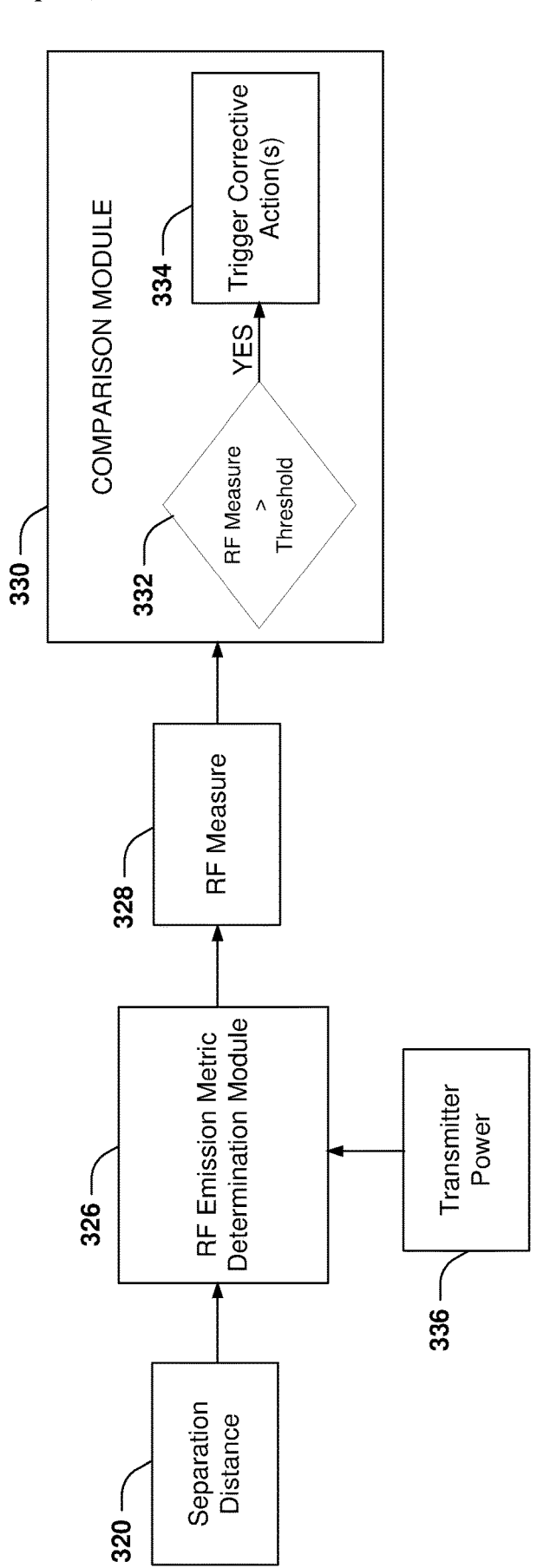
FIG. 3E is a diagram illustrating an example system for determining RF emission metrics associated with an antenna system and/or controlling a transmitter power of the antenna system based upon the determined RF metrics, where a measure of RF emissions is determined and/or compared with a threshold according to some embodiments.

At 212 of FIG. 2, in response to a determination that the first measure of RF emissions meets (e.g., exceeds) the threshold measure of RF emissions, one or more corrective actions may be performed (by the controller 110, for example). FIG. 3E illustrates determining the first measure of RF emissions (shown with reference number 328) and/or triggering the one or more corrective actions. In some examples, the separation distance 320 and/or the transmitter power (shown with reference number 336) of the antenna system 102 may be input to a RF emission metric determination module 326, which may use the separation distance 320 and/or the transmitter power 336 to determine the first measure of RF emissions 328. The first measure of RF emissions 328 may be input to a comparison module 330, which may compare the first measure of RF emissions 328 with the threshold measure of RF emissions to determine 332 whether the first measure of RF emissions 328 meets (e.g., exceeds) the threshold measure of RF emissions. The one or more corrective actions may be triggered 334 in response to a determination that the first measure of RF emissions 328 meets (e.g., exceeds) the threshold measure of RF emissions.

In some examples, the one or more corrective actions may comprise reducing the transmitter power 336 of the antenna system 102 from a first transmitter power (e.g., a first maximum transmitter power) to a second transmitter power (e.g., a second maximum transmitter power) lower than the first transmitter power. In some examples, reducing the transmitter power 336 of the antenna system 102 may comprise modifying a transmitter power parameter (e.g., a maximum power parameter) of the antenna system 102 from a value corresponding to the first transmitter power to a value corresponding to the second transmitter power. In some examples, the transmitter power 336 may be reduced to the second transmitter power based upon a determination that the second transmitter power results in the first measure of RF emissions 328 decreasing to a value that does not meet (e.g., does not exceed) the threshold measure of RF emissions. Accordingly, by reducing the transmitter power 336 in response to the determination that the first measure of RF emissions 328 meets (e.g., exceeds) the threshold measure of RF emissions, exposure of the first object 310 (e.g., the first person 302) to more than the threshold measure of RF emissions may be mitigated. In an example in which the threshold measure of RF emissions is lower than a MPE limit for RF emissions, reducing the transmitter power 336 in response to the determination that the first measure of RF emissions 328 meets (e.g., exceeds) the threshold measure of RF emissions may prevent the first measure of RF emissions 328 associated with the first object 310 (e.g., the first person 302) from meeting (e.g., exceeding) the MPE limit for RF emissions, thereby automatically satisfying regulatory requirements and/or providing for increased safety associated with the antenna system 102.

In some examples, the controller 110 may update (e.g., periodically and/or continuously update) and/or monitor (e.g., periodically and/or continuously monitor) the separation distance 320, the transmitter power 336 and/or the first measure of RF emissions 328. The controller 110 may control (e.g., dynamically attenuate) the transmitter power 336 based upon updated values (e.g., real time values) of the separation distance 320, the transmitter power 336 and/or the first measure of RF emissions 328.

Accordingly, when the first object 310 (e.g., the first person 302) moves closer to the antenna system 102 and/or the one or more antennas 104, the controller 110 may dynamically reduce the transmitter power 336 to prevent the first measure of RF emissions 328 from meeting (e.g., exceeding) the MPE limit for RF emissions. In an example, when the first object 310 (e.g., the first person 302) moves closer to the antenna system 102 and/or the one or more antennas 104, the controller 110 may detect a corresponding decrease of the separation distance 320 and/or increase of the first measure of RF emissions 328, and may reduce the transmitter power 336 based upon the decrease of the separation distance 320 and/or the increase of the first measure of RF emissions 328 (e.g., the controller 110 may reduce the transmitter power 336 to lower the first measure of RF emissions 328 associated with the first object 310 to a value lower than the threshold measure of RF emissions, for example).

Alternatively and/or additionally, when the first object 310 (e.g., the first person 302) moves further away from the antenna system 102 and/or the one or more antennas 104, the controller 110 may dynamically increase the transmitter power 336 until the transmitter power 336 reaches a maximum value associated with the antenna system 102 (e.g., the maximum value may correspond to a maximum transmitter power parameter of the antenna system 102). In an example, when the first object 310 (e.g., the first person 302) moves further away from the antenna system 102 and/or the one or more antennas 104, the controller 110 may detect a corresponding increase of the separation distance 320 and/or decrease of the first measure of RF emissions 328, and may increase the transmitter power 336 based upon the increase of the separation distance 320 and/or the decrease of the first measure of RF emissions 328. For example, the transmitter power 336 may be increased to a value that is at most the maximum value associated with the antenna system 102 (e.g., the maximum transmitter power parameter of the antenna system 102). Alternatively and/or additionally, the transmitter power 336 may be increased to a value that does not result in the first measure of RF emissions 328 meeting (e.g., exceeding) the threshold measure of RF emissions and/or does not result in the first measure of RF emissions 328 meeting (e.g., exceeding) the MPE limit for RF emissions.

Thus, in accordance with some embodiments, the controller 110 implements a closed-loop process in which the controller 110 monitors the separation distance 320 and/or the first measure of RF emissions 328, and uses updated values of the separation distance 320 and/or the first measure of RF emissions 328 to continuously and/or periodically update (e.g., attenuate) the transmitter power 336 of the antenna system 102.

In an example, after reducing the transmitter power 336 of the antenna system 102 from the first transmitter power to the second transmitter power, an updated value of the separation distance 320 may be determined. An updated value of the first measure of RF emissions 328 may be determined (by the controller 110, for example) based upon the updated value of the separation distance 320 and the second transmitter power. The updated value of the first measure of RF emissions 328 may be compared with the threshold measure of RF emissions. In response to a determination that the updated value of the first measure of RF emissions 328 does not meet the threshold measure of RF emissions, the transmitter power 336 of the antenna system 102 (*i*) may be increased from the second transmitter power to a third transmitter power higher than the second transmitter power, or (ii) may not be modified. Alternatively and/or additionally, in response to a determination that the updated value of the first measure of RF emissions 328 meets (e.g., exceeds) the threshold measure of RF emissions, the transmitter power 336 of the antenna system 102 may be reduced from the second transmitter power to a fourth transmitter power lower than the second transmitter power.

In some examples, the one or more corrective actions may comprise transmitting one or more RF emission overexposure alerts to one or more devices. In some examples, an alert of the one or more RF emission overexposure alerts (e.g., each alert of the one or more RF emission overexposure alerts) may comprise (i) an indication that the first measure of RF emissions 328 meets (e.g., exceeds) the threshold measure of RF emissions, (ii) an antenna identifier identifying the antenna system 102 and/or the one or more antennas 104 (e.g., the antenna identifier may comprise a location of the antenna system 102), (iii) the first transmitter power (e.g., the transmitter power 336 of the antenna system 102 prior to being reduced from the first transmitter power to the second transmitter power), and/or (iv) the second transmitter power (e.g., a current value of the transmitter power 336).

In some examples, an alert of the one or more RF emission overexposure alerts may comprise a graphical object sent to and/or displayed on a display (e.g., a television, a projector, or other type of display) viewable to the first object 310, such as the first person 302 (e.g., thereby informing the first person 302 of the first measure of RF emissions 328 meeting the threshold measure of RF emissions). The graphical object displayed on the display may instruct the first object 310 (e.g., the first person 302) to move away from the antenna system 102.

In some examples, an alert of the one or more RF emission overexposure alerts may comprise an audio message sent to and/or output via a speaker proximal the first object 310, such as the first person 302 (e.g., thereby informing the first person 302 of the first measure of RF emissions 328 meeting the threshold measure of RF emissions). The audio message output via the speaker may instruct the first object 310 (e.g., the first person 302) to move away from the antenna system 102 (e.g., the audio message may comprise "you are approaching an antenna emitting RF emissions that can be harmful to your health, please move away from the antenna").

In some examples, an alert of the one or more RF emission overexposure alerts may comprise a text message, a graphical object and/or an audio message sent as a mobile alert to a mobile device of the first object 310 (e.g., the first person 302) and/or one or more mobile devices determined to be proximal to and/or within a threshold distance of the first object 310 (e.g., the first person 302) and/or the antenna system 102. For example, the mobile alert may be a government alert comprising an AMBER alert, an emergency alert and/or a public safety alert.

In some examples, an alert of the one or more exposure alerts may be sent to one or more antenna management agents. The alert may inform the one or more antenna management agents of the first measure of RF emissions 328 meeting the threshold measure of RF emissions. In some examples, the alert sent to the one or more antenna management agents may enable the one or more antenna management agents to identify the antenna system 102, and/or perform one or more actions (e.g., at least one of disable the antenna system 102, modify one or more parameters of the antenna system 102, etc.) associated with the antenna system 102. In some examples, the alert may be indicative of a recommended transmitter power value (e.g., the second transmitter power). For example, an antenna management agent may use the recommended transmitter power value as a suggestion to (manually, for example) modify the transmitter power 336 of the antenna system 102 (to the recommended transmitter power value, for example).

In some examples, the transmitter power 336 of the antenna system 102 may be controlled based upon a scheduled time period of an event (e.g., a maintenance event, a gathering, etc.) that is within a threshold distance of the antenna system 102. For example, the controller 110 may reduce the transmitter power 336 to a reduced transmitter power during the scheduled time period.

Embodiments are contemplated in which the first measure of RF emissions 328 is not determined and/or is not used to control the transmitter power 336. In an example, the separation distance 320 may be monitored, and the controller 110 may control the transmitter power 336 based upon the separation distance 320. For example, the separation distance 320 may be compared with a threshold separation distance. The transmitter power 336 may be reduced in response to a determination that the separation distance 320 meets (e.g., exceeds) the threshold separation distance. In some examples, the transmitter power 336 may be dynamically controlled based upon the separation distance 320 using one or more of the techniques provided herein with respect to controlling the transmitter power 336 based upon the first measure of RF emissions 328. Alternatively and/or additionally, an alert (e.g., a RF emission overexposure alert) may be transmitted to one or more devices based upon the separation distance 320. For example, the alert may be transmitted to the one or more devices in response to a determination that the separation distance 320 meets (e.g., exceeds) the threshold separation distance.

Embodiments are contemplated in which one or more other devices, other than the camera 106 and/or the proximity sensor 108, are used are used to detect the first object 310 (e.g., the first person 302) and/or determine the separation distance 320.

Embodiments are contemplated in which one or more other types of objects other than persons may be detected (using the camera 106 and/or the proximity sensor 108, for example), and used to determine the separation distance 320. For example, the first person 302 may be replaced with at least one of an animal, a vehicle (e.g., a car, a bus, etc.), a flying vehicle (e.g., an airplane, a drone, etc.), a boat, etc.

Embodiments are contemplated in which disclosed techniques may be used in the context of one or more other types of systems and/or entities, other than antenna systems, and/or in association with other metrics, other than RF emission metrics. For example, emission metrics (and/or other metrics) associated with an entity (e.g., an entity that is not an antenna system, such as a power plant, an industrial facility, etc.) may be determined and/or used to control operation of one or more components of the entity and/or provide one or more alerts (e.g., based upon detection of the first object 310 and/or the separation distance 320).

Figure 4:
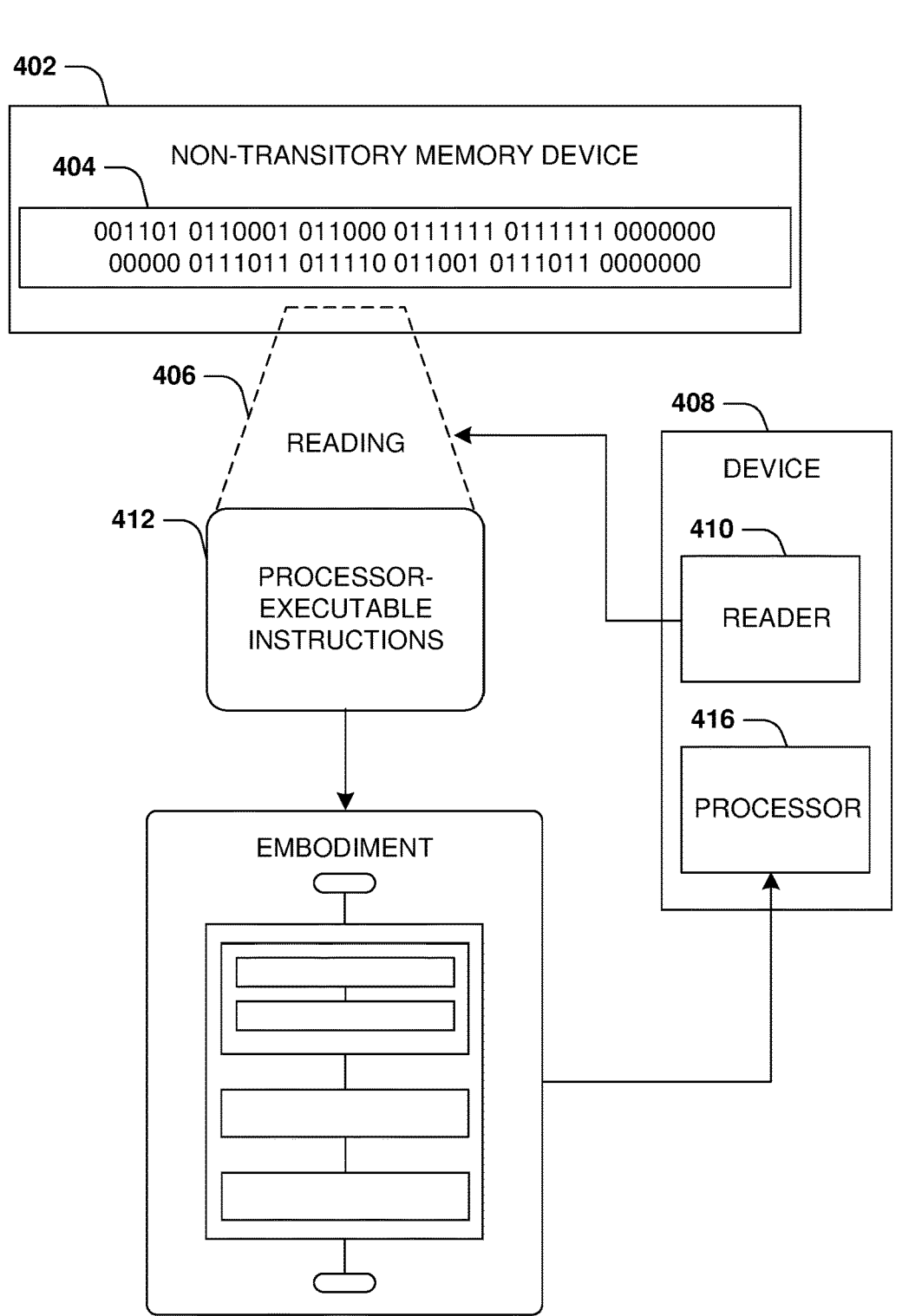
FIG. 4 is an illustration of a scenario featuring an example non-transitory machine-readable medium in accordance with one or more of the provisions set forth herein.

FIG. 4 is an illustration of a scenario 400 involving an example non-transitory machine-readable medium 402. The non-transitory machine-readable medium 402 may comprise processor-executable instructions 412 that when executed by a processor 416 cause performance (e.g., by the processor 416) of at least some of the provisions herein. The non-transitory machine-readable medium 402 may comprise a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a compact disk (CD), a digital versatile disk (DVD), or floppy disk). The example non-transitory machine-readable medium 402 stores computer-readable data 404 that, when subjected to reading 406 by a reader 410 of a device 408 (e.g., a read head of a hard disk drive, or a read operation invoked on a solid-state storage device), express the processor-executable instructions 412. In some embodiments, the processor-executable instructions 412, when executed cause performance of operations, such as at least some of the exemplary method 200 of FIG. 2, for example. In some embodiments, the processor-executable instructions 412 are configured to cause implementation of a system, such as at least some of the example system 101 of FIG. 1 and/or the example system 301 of FIGS. 3A-3E, for example.

As used in this application, "component," "module," "system", "interface", and/or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "example" is used herein to mean serving as an example, instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", and/or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Various operations of embodiments are provided herein. In an embodiment, one or more of the operations described may constitute computer-readable instructions stored on one or more computer-readable media, which if executed by a computing device, will cause the computing device to perform the operations described. The order in which some or all of the operations are described should not be construed as to imply that these operations are necessarily order dependent. Alternative ordering may be implemented without departing from the scope of the disclosure. Further, it will be understood that not all operations are necessarily present in each embodiment provided herein. Also, it will be understood that not all operations are necessary in some embodiments.

Also, although the disclosure has been shown and described with respect to one or more implementations, alterations and modifications may be made thereto and additional embodiments may be implemented based upon a reading and understanding of this specification and the annexed drawings. The disclosure includes all such modifications, alterations and additional embodiments and is limited only by the scope of the following claims. The specification and drawings are accordingly to be regarded in an illustrative rather than restrictive sense. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

To the extent the aforementioned implementations collect, store, or employ personal information of individuals, groups or other entities, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various access control, encryption and anonymization techniques for particularly sensitive information.

What is claimed is:

1. A method comprising:
   receiving a video stream from a camera associated with an antenna system;
   detecting a person in a video frame of the video stream;
   determining a separation distance between the person and a location associated with the antenna system;
   determining, based upon the separation distance and a transmitter power of the antenna system, a measure of radio frequency (RF) emissions associated with the person;
   comparing the measure of RF emissions with a threshold measure of RF emissions; and
   in response to a determination that the measure of RF emissions meets the threshold measure of RF emissions, reducing the transmitter power of the antenna system.

2. The method of claim 1, wherein determining the separation distance between the person and the location comprises:

determining the separation distance using a proximity sensor.

3. The method of claim 1, wherein determining the separation distance between the person and the location comprises:

analyzing the video frame to identify a boundary associated with the person; and determining the separation distance based upon the boundary and a focal length associated with the camera.

4. The method of claim 1, wherein detecting the person in the video frame comprises:

analyzing the video frame, using an object detection model, to identify an object; and determining that the object corresponds to a person classification.

5. The method of claim 1, comprising:

in response to the determination that the measure of RF emissions meets the threshold measure of RF emissions, transmitting a RF emission overexposure alert to one or more devices.

6. The method of claim 5, wherein:

reducing the transmitter power of the antenna system comprises reducing the transmitter power from a first transmitter power to a second transmitter power lower than the first transmitter power; and the RF emission overexposure alert is indicative of at least one of:

an indication that the measure of RF emissions meets the threshold measure of RF emissions;

an antenna identifier identifying the antenna system;

the first transmitter power; or the second transmitter power.

7. The method of claim 1, wherein:

reducing the transmitter power of the antenna system comprises reducing the transmitter power from a first transmitter power to a second transmitter power lower than the first transmitter power; and the method comprises:

after reducing the transmitter power of the antenna system, determining an updated value of the separation distance between the person and the location;

determining, based upon the updated value of the separation distance and the second transmitter power, an updated value of the measure of RF emissions associated with the person; and comparing the updated value of the measure of RF emissions with the threshold measure of RF emissions.

8. The method of claim 7, comprising:

in response to a determination that the updated value of the measure of RF emissions does not meet the threshold measure of RF emissions, at least one of:

increasing the transmitter power from the second transmitter power to a third transmitter power; or not modifying the transmitter power of the antenna system.

9. The method of claim 7, comprising:

in response to a determination that the updated value of the measure of RF emissions meets the threshold measure of RF emissions, reducing the transmitter power of the antenna system from the second transmitter power to a third transmitter power.

10. The method of claim 1, comprising:

determining a status of the person; and determining the threshold measure of RF emissions based upon the status.

11. The method of claim 10, comprising:

determining a second measure of RF emissions associated with a second person;

determining a second status of the second person;

determining a second threshold measure of RF emissions based upon the second status, wherein a difference between the second threshold measure of RF emissions and the threshold measure of RF emissions corresponds to a difference between the second status and the status; and comparing the second measure of RF emissions with the second threshold measure of RF emissions.

12. A device, comprising:

a processor configured to execute instructions to perform operations comprising:

receiving a video stream from a camera associated with an antenna system;

detecting a person in a video frame of the video stream;

determining a separation distance between the person and a location associated with the antenna system;

determining, based upon the separation distance and a transmitter power of the antenna system, a measure of radio frequency (RF) emissions associated with the person;

comparing the measure of RF emissions with a threshold measure of RF emissions; and in response to a determination that the measure of RF emissions meets the threshold measure of RF emissions, transmitting a RF emission overexposure alert to one or more devices.

13. The device of claim 12, wherein determining the separation distance between the person and the location comprises:

determining the separation distance using a proximity sensor.

14. The device of claim 12, wherein determining the separation distance between the person and the location comprises:

analyzing the video frame to identify a boundary associated with the person; and determining the separation distance based upon the boundary and a focal length associated with the camera.

15. The device of claim 12, wherein detecting the person in the video frame comprises:

analyzing the video frame, using an object detection model, to identify an object; and determining that the object corresponds to a person classification.

16. The device of claim 12, the operations comprising:

in response to the determination that the measure of RF emissions meets the threshold measure of RF emissions, reducing the transmitter power from a first transmitter power to a second transmitter power.

17. The device of claim 16, wherein the RF emission overexposure alert is indicative of at least one of:

an indication that the measure of RF emissions meets the threshold measure of RF emissions;

an antenna identifier identifying the antenna system;

the first transmitter power; or the second transmitter power.

18. The device of claim 12, the operations comprising:

determining a status of the person; and determining the threshold measure of RF emissions based upon the status.

19. A non-transitory computer-readable medium storing instructions that when executed perform operations comprising:

receiving a video stream from a camera associated with an antenna system;

detecting a person in a video frame of the video stream;

determining a separation distance between the person and a location associated with the antenna system;

determining, based upon the separation distance and a transmitter power of the antenna system, a measure of radio frequency (RF) emissions associated with the person;

comparing the measure of RF emissions with a threshold measure of RF emissions; and in response to a determination that the measure of RF emissions meets the threshold measure of RF emissions, at least one of reducing the transmitter power of the antenna system or transmitting a RF emission overexposure alert to one or more devices.

20. The non-transitory computer-readable medium of claim 19, wherein determining the separation distance between the person and the location comprises:

determining the separation distance using a proximity sensor.

\* \* \* \* \*